United States Patent
Hegde et al.

(10) Patent No.: US 9,213,375 B2
(45) Date of Patent: Dec. 15, 2015

(54) ENCLOSURE ASSEMBLY AND SYSTEMS AND METHODS FOR USING THE SAME

(75) Inventors: Shashikant G. Hegde, San Jose, CA (US); Ashutosh Y. Shukla, Santa Clara, CA (US); Kenta K. Williams, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 595 days.

(21) Appl. No.: 13/605,625

(22) Filed: Sep. 6, 2012

(65) Prior Publication Data
US 2014/0063821 A1 Mar. 6, 2014

(51) Int. Cl.
| | |
|---|---|
| H05K 7/00 | (2006.01) |
| G06F 1/16 | (2006.01) |
| H04N 5/225 | (2006.01) |
| H05K 3/32 | (2006.01) |
| H04M 1/02 | (2006.01) |

(52) U.S. Cl.
CPC ............ *G06F 1/1686* (2013.01); *G06F 1/1626* (2013.01); *H04M 1/0264* (2013.01); *H04N 5/2257* (2013.01); *H05K 3/323* (2013.01); *H04M 1/026* (2013.01); *Y10T 29/49002* (2015.01)

(58) Field of Classification Search
CPC ....... F21V 21/00; G03B 17/00; G06F 1/1626; G06F 1/1686; H04M 1/0202; H04M 1/026; H04M 1/0264; Y10T 29/49002
USPC ........... 361/728, 774, 776, 778; 174/520, 527
See application file for complete search history.

(56) References Cited

U.S. PATENT DOCUMENTS

| | | | |
|---|---|---|---|
| 7,121,864 B1* | 10/2006 | Yang | 439/331 |
| 7,559,131 B2* | 7/2009 | Credelle et al. | 29/600 |
| 7,820,918 B2 | 10/2010 | Chang | |
| 8,054,634 B2* | 11/2011 | Seo | 361/728 |
| 8,144,243 B2 | 3/2012 | Kang | |
| 2008/0119070 A1* | 5/2008 | Yang | 439/77 |
| 2011/0026206 A1* | 2/2011 | Bernard et al. | 361/679.01 |
| 2011/0096224 A1* | 4/2011 | Lee | 348/374 |
| 2011/0222246 A1* | 9/2011 | Hsieh et al. | 361/720 |
| 2011/0255850 A1* | 10/2011 | Dinh | G03B 15/03 396/176 |
| 2013/0094151 A1 | 4/2013 | Escamilla et al. | |
| 2013/0128100 A1* | 5/2013 | Son | 348/357 |

* cited by examiner

*Primary Examiner* — Yuriy Semenenko
(74) *Attorney, Agent, or Firm* — Joseph F. Guihan

(57) ABSTRACT

An enclosure assembly and systems and methods for using the same are disclosed. The enclosure assembly may include a base plate, a plurality of sidewalls, and one or more insulator layers disposed on the sidewalls. When coupled to a module, the enclosure assembly may least partially enclose the module to prevent the spread of EMI, to assist in heat dissipation, to protect the structural integrity of the module, and the like.

18 Claims, 13 Drawing Sheets

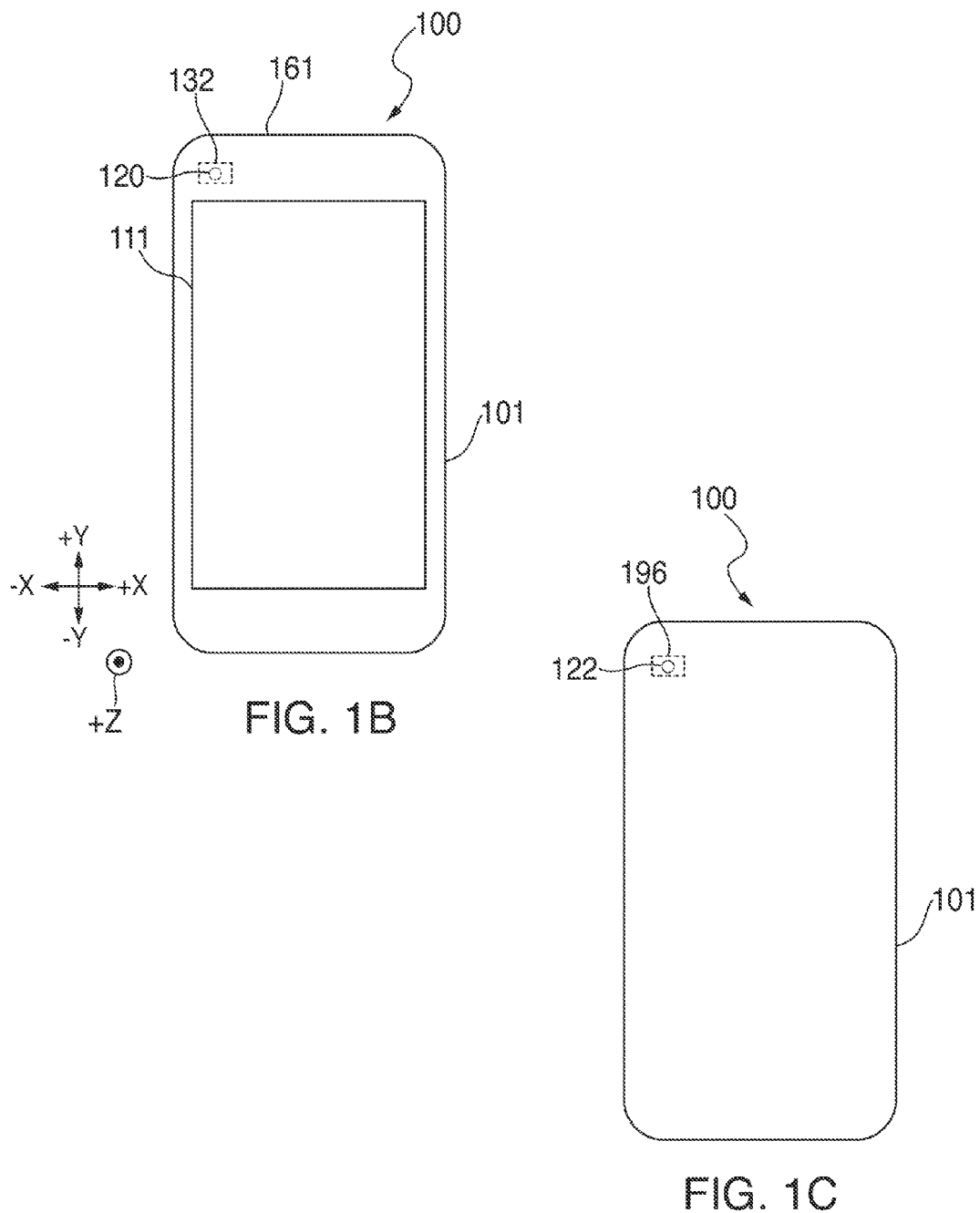

ENCLOSURE ASSEMBLY AND SYSTEMS AND METHODS FOR USING THE SAME

FIELD OF THE INVENTION

This can relate to an enclosure assembly and systems and methods for using the same.

BACKGROUND OF THE DISCLOSURE

Many electronic devices include one or more electronic modules. These electronic modules may include electronic components or assemblies (e.g., a camera module, a speaker module, a camera LED, etc.) that may each be dedicated for a particular function of the electronic device. It is known that a camera module typically communicates high-speed signals with one or more other components of an electronic device. These high-speed signals may cause electromagnetic interference ("EMI") that may interfere with the operation of other components of the electronic device. In addition, a camera module typically heats up during operation, and excess heat may affect the performance of the camera module. Moreover, a typical camera module may include one or more movable components (e.g., an auto-focus motor) whose performance may be affected by intrusive particles. Furthermore, a typical camera module may also include fragile components (e.g., a substrate) that may be subject to damage during assembly of the electronic device.

SUMMARY OF THE DISCLOSURE

An enclosure assembly and systems and methods for using the same are provided.

In some embodiments, a system may be provided. The system may include a circuit board, and a module mounted on the circuit board and having a substrate. The substrate may include at least one exposed electrically conductive element. The system may also include a conductive enclosure assembly operative to at least partially enclose the module. The conductive enclosure assembly may include a base plate, a plurality of sidewalls that each extends from a corresponding edge of the base plate, and an insulator layer disposed on at least one of the sidewalls. The insulator layer may be operative to couple to the at least one exposed electrically conductive element when the conductive enclosure assembly encloses the module.

In some embodiments, an enclosure assembly for enclosing a module may be provided. The enclosure assembly may include a bottom surface, a plurality of side surfaces coupled to the bottom surface to form a module containing area having an inner surface, and at least one dielectric element disposed on the inner surface of the module containing area and operative to couple to at least one exposed electrical terminal on the module when the enclosure assembly encloses the module.

In some embodiments, a method for at least partially enclosing a module with an enclosure assembly may be provided. The module may include a casing and a substrate having a plurality of exposed leads. The enclosure assembly may include a module enclosing region having at least one dielectric disposed thereon. The method may include coupling the at least one dielectric to the plurality of exposed leads, and fixing the casing to the module enclosing region to at least partially enclose the module.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which:

FIG. 1B is a front view of the electronic device of FIG. 1A, in accordance with at least one embodiment;

FIG. 1C is a back view of the electronic device of FIG. 1A, in accordance with at least one embodiment;

DETAILED DESCRIPTION OF THE DISCLOSURE

An enclosure assembly and systems and methods for using the same are described with reference to FIGS. 1-10.

Figure 1A:
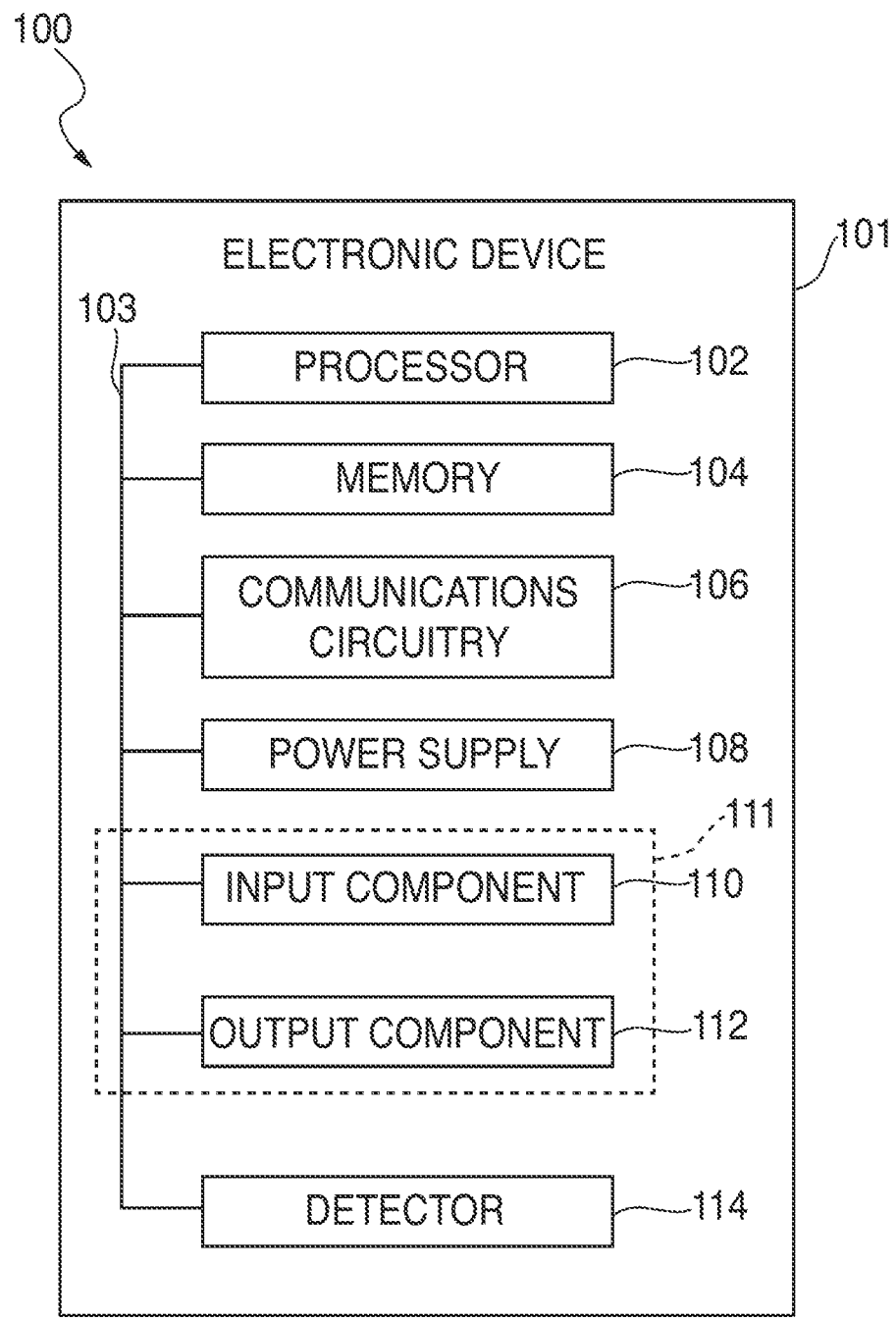
FIG. 1A is a schematic view of an illustrative electronic device, in accordance with at least one embodiment.

FIG. 1A is a schematic view of an illustrative electronic device 100. In some embodiments, electronic device 100 may perform a single function (e.g., a device dedicated to storing image content) and, in other embodiments, electronic device 100 may perform multiple functions (e.g., a device that stores image content, plays music, and receives and transmits telephone calls). Moreover, in some embodiments, electronic device 100 may be any portable, mobile, or hand-held electronic device configured to control output of content. Alternatively, electronic device 100 may not be portable at all, but may instead be generally stationary. Electronic device 100 may include any suitable type of electronic device operative to control output of content. For example, electronic device 100 may include a media player (e.g., an iPod™ available by Apple Inc. of Cupertino, Calif.), a cellular telephone (e.g., an iPhone™ available by Apple Inc.), a personal e-mail or messaging device (e.g., a Blackberry™ available by Research In Motion Limited of Waterloo, Ontario), any other wireless communication device, a pocket-sized personal computer, a personal digital assistant ("PDA"), a tablet, a laptop computer, a desktop computer, a music recorder, a still camera, a movie or video camera or recorder, a radio, medical equipment, any other suitable type of electronic device, and any combinations thereof.

Electronic device 100 may include a processor or control circuitry 102, memory 104, communications circuitry 106, power supply 108, input component 110, output component 112, and a detector 114. Electronic device 100 may also include a bus 103 that may provide a transfer path for transferring data and/or power, to, from, or between various other components of device 100. In some embodiments, one or more components of electronic device 100 may be combined or omitted. Moreover, electronic device 100 may include other components not combined or included in FIG. 1A. For example, electronic device 100 may include motion detection circuitry, light sensing circuitry, positioning circuitry, or several instances of the components shown in FIG. 1A. For the sake of simplicity, only one of each of the components is shown in FIG. 1A.

Memory 104 may include one or more storage mediums, including for example, a hard-drive, flash memory, permanent memory such as read-only memory ("ROM"), semi-permanent memory such as random access memory ("RAM"), any other suitable type of storage component, or any combination thereof. Memory 104 may include cache memory, which may be one or more different types of memory used for temporarily storing data for electronic device applications. Memory 104 may store media data (e.g., music, image, and video files), software (e.g., for implementing functions on device 100), firmware, preference information (e.g., media playback preferences), lifestyle information (e.g., food preferences), exercise information (e.g., information obtained by exercise monitoring equipment), transaction information (e.g., information such as credit card information), wireless connection information (e.g., information that may enable device 100 to establish a wireless connection), subscription information (e.g., information that keeps track of podcasts or television shows or other media a user subscribes to), contact information (e.g., telephone numbers and e-mail addresses), calendar information, any other suitable data, or any combination thereof.

Communications circuitry 106 may be provided to allow device 100 to communicate with one or more other electronic devices or servers using any suitable communications protocol. For example, communications circuitry 106 may support Wi-Fi (e.g., an 802.11 protocol), Ethernet, Bluetooth™, high frequency systems (e.g., 900 MHz, 2.4 GHz, and 5.6 GHz communication systems), infrared, transmission control protocol/internet protocol ("TCP/IP") (e.g., any of the protocols used in each of the TCP/IP layers), hypertext transfer protocol ("HTTP"), BitTorrent™, file transfer protocol ("FTP"), real-time transport protocol ("RTP"), real-time streaming protocol ("RTSP"), secure shell protocol ("SSH"), any other communications protocol, or any combination thereof. Communications circuitry 106 may also include circuitry that can enable device 100 to be electrically coupled to another device (e.g., a computer or an accessory device) and communicate with that other device, either wirelessly or via a wired connection.

Power supply 108 may provide power to one or more of the other components of device 100. In some embodiments, power supply 108 can be coupled to a power grid (e.g., when device 100 is not a portable device, such as a desktop computer). In some embodiments, power supply 108 can include one or more batteries for providing power (e.g., when device 100 is a portable device, such as a cellular telephone). As another example, power supply 108 can be configured to generate power from a natural source (e.g., solar power using solar cells).

One or more input components 110 may be provided to permit a user to interact or interface with device 100. For example, input component 110 can take a variety of forms, including, but not limited to, an electronic device pad, dial, click wheel, scroll wheel, touch screen, one or more buttons (e.g., a keyboard), mouse, joy stick, track ball, a microphone, and combinations thereof. For example, input component 110 may include a multi-touch screen. Each input component 110 can be configured to provide one or more dedicated control functions for making selections or issuing commands associated with operating device 100.

Electronic device 100 may also include one or more output components 112 that may present information (e.g., textual, graphical, audible, and/or tactile information) to a user of device 100. Output component 112 of electronic device 100 may take various forms, including, but not limited, to audio speakers, in-ear earphones, headphones, audio line-outs, visual displays, antennas, infrared ports, rumblers, vibrators, or combinations thereof.

For example, output component 112 of electronic device 100 may include an image display 112 as an output component. Such an output component display 112 may include any suitable type of display or interface for viewing image data captured by detector 114. In some embodiments, display 112 may include a display embedded in device 100 or coupled to device 100 (e.g., a removable display). Display 112 may include, for example, a liquid crystal display ("LCD"), a light emitting diode ("LED") display, an organic light-emitting diode ("OLED") display, a surface-conduction electron-emitter display ("SED"), a carbon nanotube display, a nanocrystal display, any other suitable type of display, or combination thereof. Alternatively, display 112 can include a movable display or a projecting system for providing a display of content on a surface remote from electronic device 100, such as, for example, a video projector, a head-up display, or a three-dimensional (e.g., holographic) display.

In some embodiments, output component 112 may include an audio output module that may be coupled to an audio connector (e.g., a male audio jack) for interfacing with an audio device (e.g., a headphone, an in-ear earphone, a microphone, etc.).

It should be noted that one or more input components 110 and one or more output components 112 may sometimes be referred to collectively herein as an I/O interface (e.g., input component 110 and output component 112 as I/O interface 111). It should also be noted that input component 110 and output component 112 may sometimes be a single I/O component, such as a touch screen that may receive input information through a user's touch of a display screen and that may also provide visual information to a user via that same display screen.

Detector 114 may include one or more sensors of any suitable type that may capture human recognition data (e.g., face data) that may be utilized to detect the presence of one or more individuals. For example, detector 114 may include an image sensor and/or an infrared sensor. The image sensor may include one or more cameras with any suitable lens or number of lenses that may be operative to capture images of the surrounding environment of electronic device 100. For example, the image sensor may include any number of optical or digital lenses for capturing light reflected by the device's environment as an image. The captured light may be stored as an individual distinct image or as consecutive video frame images of a recording (e.g., several video frames including a primary frame and one or more subsequent frames that may indicate the difference between the primary frame and the subsequent frame). As used herein, the term "camera lens" may be understood to mean a lens for capturing light or a lens and appropriate circuitry for capturing and converting captured light into an image that can be analyzed or stored by electronic device 100 as either an individual distinct image or as one of many consecutive video frame images.

In some embodiments, detector 114 may also include one or more sensors that may detect any human feature or characteristic (e.g., physiological, psychological, physical, movement, etc.). For example, detector 114 may include a microphone for detecting voice signals from one or more individuals. As another example, detector 114 may include a heartbeat sensor for detecting heartbeats of one or more individuals. As yet other examples, detector 114 may include a fingerprint reader, an iris scanner, a retina scanner, a breath sampler, and a humidity sensor that may detect moisture and/or sweat emanating from any suitable portion of an individual's body. For example, detector 114 may include a humidity sensor that may be situated near or coupled to one or more portions of input component 110, and that may detect moisture and/or sweat from an individual's hands. It should be appreciated that any detector 114 may include any sensor that may detect any human feature or characteristic.

In some embodiments, detector 114 may also include positioning circuitry for determining a current position of device 100. The positioning circuitry may be operative to update the current position at any suitable rate, including at relatively high rates to provide an estimation of speed and distance traveled. In some embodiments, the positioning circuitry may include a global positioning system ("GPS") receiver for accessing a GPS application function call that may return geographic coordinates (i.e., a geographic location) of the device. The geographic coordinates may be fundamentally, alternatively, or additionally, derived from any suitable trilateration or triangulation technique. For example, the positioning circuitry may determine the current location of device 100 by using various measurements (e.g., signal-to-noise ratio ("SNR") or signal strength) of a network signal (e.g., a cellular telephone network signal) that may be associated with device 100. For example, a radio frequency ("RF") triangulation detector or sensor integrated with or connected to device 100 may determine the (e.g., approximate) current location of device 100. Device 100's current location may be determined based on various measurements of device 100's own network signal, such as, for example: (1) an angle of the signal's approach to or from one or more cellular towers, (2) an amount of time for the signal to reach one or more cellular towers or device 100, (3) the strength of the signal when it reaches one or more towers or device 100, or any combination of the aforementioned measurements. Other forms of wireless-assisted GPS (e.g., enhanced GPS or A-GPS) may also be used to determine the current position of device 100. Instead or in addition, the positioning circuitry may determine the current location of device 100 based on a wireless network or access point that may be in range or a wireless network or access point to which device 100 may be currently connected. For example, because wireless networks may have a finite range, a wireless network that may be in range of device 100 may indicate that device 100 is located in within a detectable vicinity of the wireless network. In some embodiments, device 100 may automatically connect to a wireless network that may be in range in order to receive valid modes of operation that may be associated or that may be available at the current position of device 100.

In some embodiments, detector 114 may also include motion sensing circuitry for detecting motion of an environment of device 100 and/or objects in the environment. For example, the motion sensing circuitry may detect a movement of an object (e.g., an individual) about device 100 and may generate one or more signals based on the detection.

Processor 102 of device 100 may control the operation of many functions and other circuitry provided by device 100. For example, processor 102 may receive input signals from input component 110 and/or drive output signals through display 112. Processor 102 may load a manager program (e.g., a program stored in memory 104 or another device or server accessible by device 100) to process or analyze data received via detector 114 or inputs received via input component 110 to control output of content that may be provided to the user via output component 112 (e.g., display 112). Processor 102 may associate different metadata with the human recognition data captured by detector 114, including, for example, positioning information, device movement information, a time code, a device identifier, or any other suitable metadata. Electronic device 100 (e.g., processor 102, any circuitry of detector 114, or any other component available to device 100) may be configured to capture data with detector 114 at various resolutions, frequencies, intensities, and various other characteristics as may be appropriate for the capabilities and resources of device 100.

Electronic device 100 may also be provided with a housing 101 that may at least partially enclose one or more of the components of device 100 for protecting them from debris and other degrading forces external to device 100. In some embodiments, one or more of the components may be provided within its own housing (e.g., input component 110 may be an independent keyboard or mouse within its own housing that may wirelessly or through a wire communicate with processor 102, which may be provided within its own housing).

FIG. 1B is a front view of electronic device 100. As shown in FIG. 1B, housing 101 may at least partially enclose I/O interface 111. Moreover, electronic device 100 may include a camera module 132 (e.g., an auto-focus ("AF") camera) that may reside within housing 101. Housing 101 may include a glass-covered aperture 120 that may provide camera module 132 with visual access to at least a portion of the environment (e.g., the portion of the environment that the front side of electronic device 100 may be facing). In particular, glass-covered aperture 120 may be situated adjacent to camera module 132 and may provide visual access to optics components (not shown in FIG. 1B) of camera module 132. For example, when a user operates electronic device 100 to capture one or more images of the environment, camera module 132 may be operable to capture the one or more images in the +Z-direction.

Although typical electronic devices may only include a single camera module, electronic device 100 may include a plurality of camera modules. FIG. 1C is a back view of electronic device 100. As shown in FIG. 1C, electronic device 100 may include a glass-filled aperture 122 through another portion of housing 101 and may, in addition to camera module 132, include a camera module 196 (e.g., another AF camera). Glass-covered aperture 122 may be situated on a back surface of housing 101 (e.g., near a top portion of the back surface) and may face a direction opposite the +Z direction of FIG. 1B. Similar to glass-covered aperture 120, glass-covered aperture 122 may be situated adjacent to camera module 196 and may provide visual access to optics components (not shown in FIG. 1B) of camera module 196. When a user operates electronic device 100 to capture one or more images of the environment, additionally or alternative, camera module 196 may, for example, be operable to capture the one or more images in a direction opposite the +Z-direction of FIG. 1B. Situating camera modules 132 and 196 on opposite sides of electronic device 100 may allow electronic device 100 to capture images regardless of the orientation of electronic device 100 with respect to its environment.

Figure 2A:
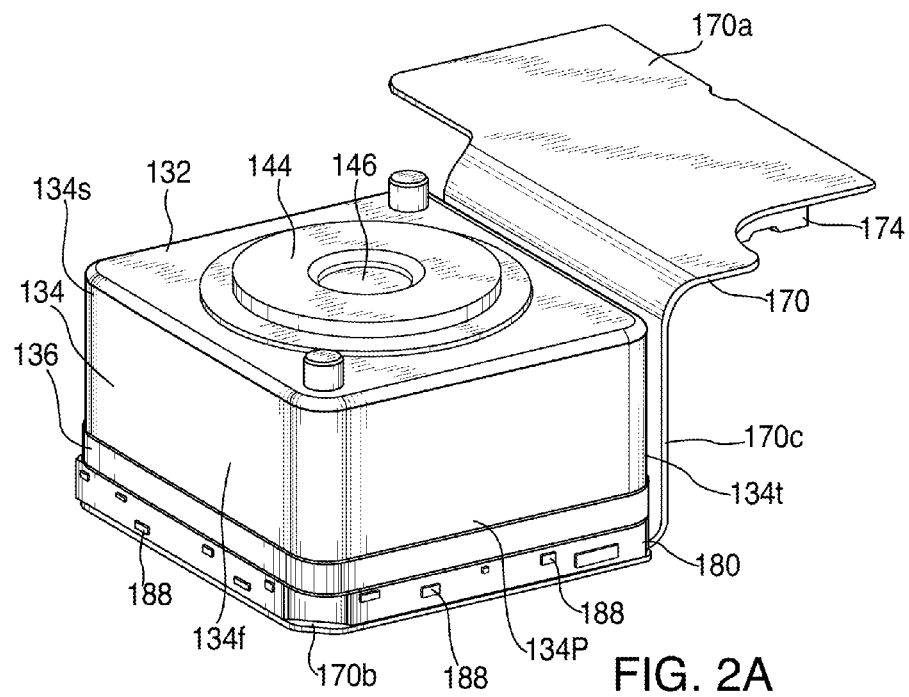
FIG. 2A is a view of a camera module and a circuit board of the electronic device of FIG. 1A, from a first perspective, in accordance with at least one embodiment.
Figure 2B:
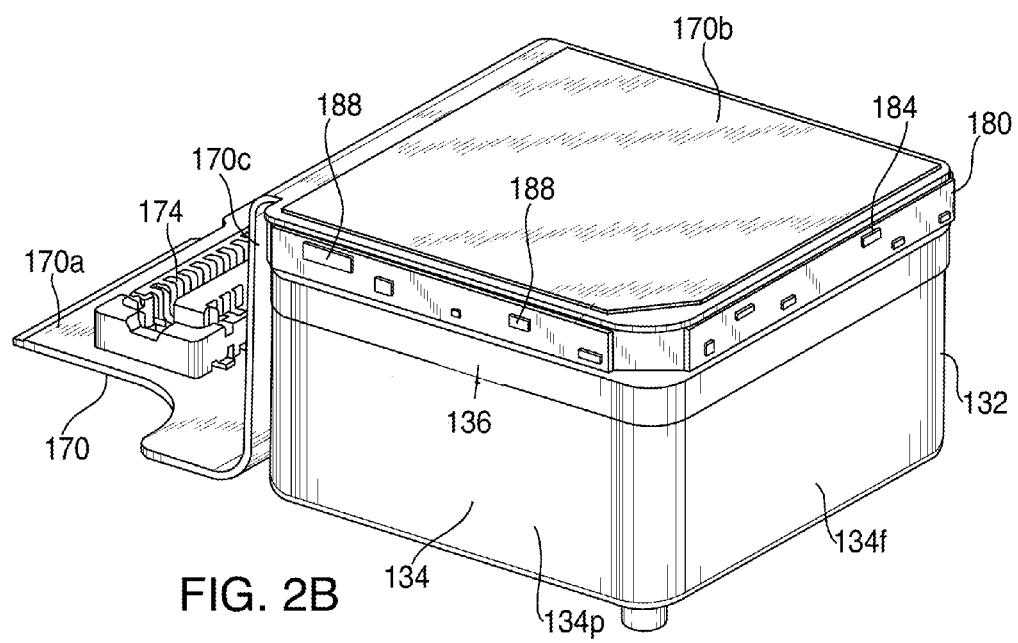
FIG. 2B is another view of the camera module and circuit board of the electronic device of FIG. 1A, from a second perspective, in accordance with at least one embodiment.

FIG. 2A is a view of camera module 132 and a circuit board 170 of the electronic device 100, from a first perspective. FIG. 2B is another view of camera module 132 and circuit board 170, from a second perspective. As shown in FIGS. 2A and 2B, camera module 132 may include a casing 134, a base structure 136, and a substrate 180. Casing 134 may be composed of and/or include any suitable material (e.g., metal, ferromagnetic metal, gold coating, silver coating, nickel coating, etc.) and may include surfaces 134p, 134f, 134s, and 134r. Casing 134 may reside on base structure 136. In some embodiments, casing 134 and base structure 136 may form a single unit. Base structure 136 may also be composed of any suitable material (e.g., plastic), and may include surfaces 136p, 136f, 136s, and 136r. Base structure 136 may, in turn, reside on substrate 180. Substrate 180 may be composed of any suitable material (e.g., ceramic) and may include at least surfaces 182, 183, and 184. Substrate 180 may also include a plurality of traces (not shown in FIGS. 2A and 2B), some of which may terminate as an exposed electrical terminal 188 on a particular surface of substrate 180.

Camera module 132 may include optics component 146 and an optics protector 144. Optics protector 144 may provide physical protection for at least a portion of optics component 146. Optics component 146 may reside within casing 134 and may include one or more lenses that may be employed by camera module 132 during a capture of images. A voice coil motor ("VCM") (not shown in FIGS. 2A and 2B) may also reside within casing 134. In some embodiments, a portion of the VCM may reside within casing 134.

As shown in FIGS. 2A and 2B, camera module 132 may reside on a portion of circuit board 170. In particular, substrate 180 may reside on (e.g., via anisotropic conductive film ("ACF") bonding) a circuit board portion 170b of circuit board 170. In some embodiments, circuit board portion 170b may be cut or trimmed so as to not extend beyond camera module 132. This trimming of circuit board portion 170b may, for example, be performed prior to, during, or after mounting of substrate 180 thereon. Circuit board portion 170b may be coupled to a circuit board portion 170a via a connecting portion 170c. Circuit board portion 170a may include several of components 174 mounted thereon, and may, for example, be coupled to one or more other components (e.g., processor 102, memory 104, etc.) of electronic device 100.

As shown in FIGS. 2A and 2B, connecting portion 170c may bend and lead to each of circuit board portions 170a and 170b. Circuit board portion 170b may be substantially parallel to circuit board portion 170a, and may be coupled to a bottom surface of substrate 180. Although not shown in FIGS. 2A and 2B, certain electrical contacts (e.g., that may reside on a bottom surface of substrate 180) may couple to a corresponding electrical contact on circuit board portion 170b. In this manner, circuit board 170 may allow communication of information or data between camera module 132 and one or more other components of electronic device 100. Moreover, circuit board 170 may include one or more accessible ground contacts (not shown in FIGS. 2A and 2B) that may provide ground points for any components of electronic device 100 that may require grounding. For example, one or more electrical contacts on the bottom surface of substrate 180 may couple to corresponding ground points of circuit board portion 170b.

During usage, camera module 132 and 192 may, for example, be configured to communicate with other components (e.g., processor 102, memory 104, etc.) of electronic device 100 via high-speed signals. These high-speed signals may leak or be undesirably emitted by various electrical components. In particular, these high-speed signals may leak via exposed electrical terminals 188 of substrate 180, which may result in electromagnetic interference ("EMI"). This EMI may interfere with the operation of one or more components of electronic device 100.

In addition, camera module 132 may heat up during operation thereof. For example, the continuous operation of an image sensor of camera module 132 may increase the temperature of camera module 132. This increase in temperature, if maintained, may affect the performance of one or more components of camera module 132 over time. Moreover, camera module 132 may include one or more internal movable components (e.g., an auto-focus motor) that may each move in a predefined manner during operation. If external particles (e.g., dust or dirt from filthy environments) find their way into electronic device 100 and into casing 134, the performance of the movable components of camera module 132 may become affected.

Furthermore, camera module 132 may also include one or more fragile components (e.g., substrate 180). During assembly of electronic device 100, various tools may be utilized to integrate certain components to housing 101. If care is not exercised during this assembly, the fragile components of camera module 132 may become damaged. For example, a substrate 180 of camera module 132 may crack (e.g., micro crack) or fracture.

Each of the aforementioned issues may affect both the performance of camera module 132 and electronic device 100.

Figure 3:
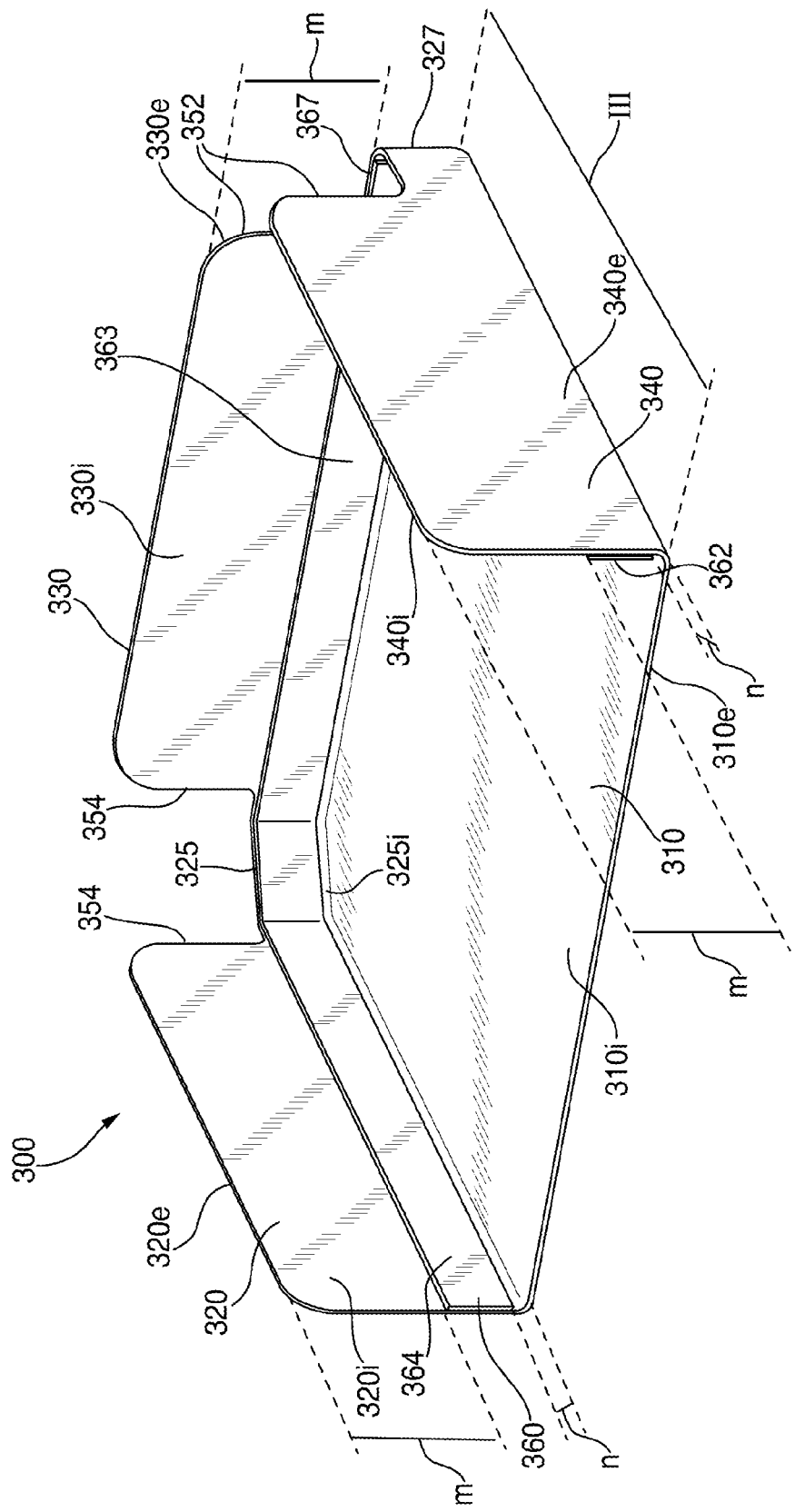
FIG. 3 is a perspective view of an enclosure assembly, in accordance with at least one embodiment.

FIG. 3 is a perspective view of an enclosure assembly 300. Enclosure assembly 300 may be configured to exhibit a box-like or tray-like shape for enclosing and/or containing an object. Enclosure assembly 300 may be composed of any suitable material (e.g., metal, stainless steel, etc.). Moreover, enclosure assembly 300 may also be coated with a conductive coating (e.g., a gold coating, a silver coating, a nickel coating, a bronze coating, etc.). As shown in FIG. 3, enclosure assembly 300 may include a base plate 310, and a plurality of sidewalls 320, 330, and 340. Each one of base plate 310 and sidewalls 320, 330, and 340 may include corresponding internal and external sides. For example, base plate 310 may include an internal surface 310i and an external surface 310e. Sidewalls 320, 330, and 340 may include internal surfaces 320i, 330i, and 340i, respectively, and external surfaces 320e, 330e, and 340e. Moreover, enclosure assembly 300 may include a gap 352 that may exist between a portion of sidewall 330 and a portion of sidewall 340, and a gap 354 that may exist between a portion of sidewall 320 and a portion of sidewall 330. Enclosure assembly 300 may also include a corner portion 327 that may be adjacent to gap 352, and a corner portion 325 that may be adjacent to gap 354 and corner portion 325 may, for example, be configured to align with a corresponding corner portion of substrate 180.

Each one of gaps 352 and 354 may, for example, provide spacing that may allow manufacturing and/or assembly of electronic device 100 to be made simpler. However, each one of gaps 352 and 354 may expose certain portions of camera module 132, which may affect camera module 132's ability to cause EMI. Thus, in some embodiments, after enclosure assembly 300 encloses camera module 132 and circuit board portion 170b, conductive tape (not shown in FIG. 3) may be applied to at least partially cover gaps 352 and 354.

As shown in FIG. 3, enclosure assembly 300 may also include an insulator layer 360 that may be composed of any suitable material (e.g., Polyimide Tape, insulative paint, etc.). In some embodiments insulator layer 360 may be a dielectric. Insulator 360 may reside above base plate 310 (e.g., by a predetermined distance n) and on internal surfaces of sidewalls 320, 330, and 340. In particular, insulator layer 360 may include insulator layer portions 362, 363, and 364 that may reside along sidewalls 320, 330, and 340, respectively (e.g., along internal surfaces 320i, 330i, and 340i, respectively). Insulator layer 360 may include a corner portion 365 that may reside along internal surface 325i of corner portion 325, and may also include a corner portion 367 that may reside along an internal surface of corner portion 327. In addition to providing alignment with a corresponding corner portion of substrate 180, corner portion 325 may also provide alignment for positioning of insulator layer 360 onto sidewalls 320, 330, and 340 of enclosure assembly 300.

Enclosure assembly 300 may be manufactured in any one of variety of ways. In some embodiments, for example, enclosure assembly 300 may be manufactured by first forming the entirety of sidewalls 320, 330, 340, and corner portions 325 and 327 as a single unit, and then coupling the single unit to base plate 310. In other embodiments, for example, enclosure assembly 300 may be manufactured by first forming each one of sidewalls 320, 330, 340, and corner portions 325 and 327 individually. These individual components may then be coupled to each other and to base plate 310. In yet other embodiments, the entirety of enclosure assembly 300 may be formed as a single unit. For example, the entirety of enclosure assembly 300 may be formed by welding or stamping. Thus, it should be appreciated that enclosure assembly 300 may be manufactured or produced using any suitable method.

Figure 4A:
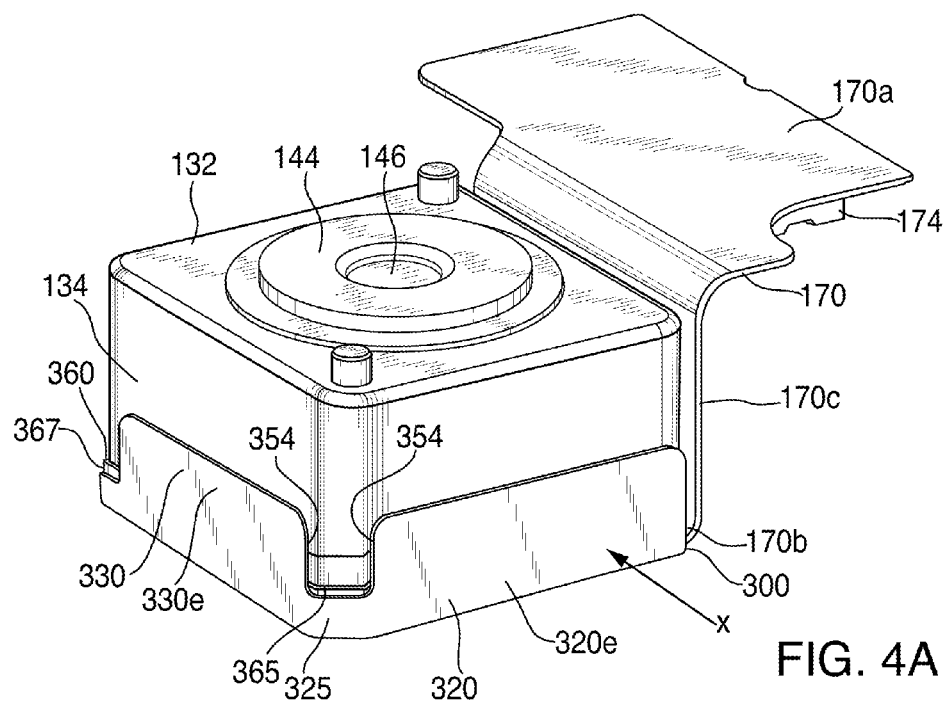
FIG. 4A is a view, similar to FIG. 2A, of the camera module and circuit board of FIG. 2A being enclosed by the enclosure assembly of FIG. 3, in accordance with at least one embodiment.
Figure 4B:
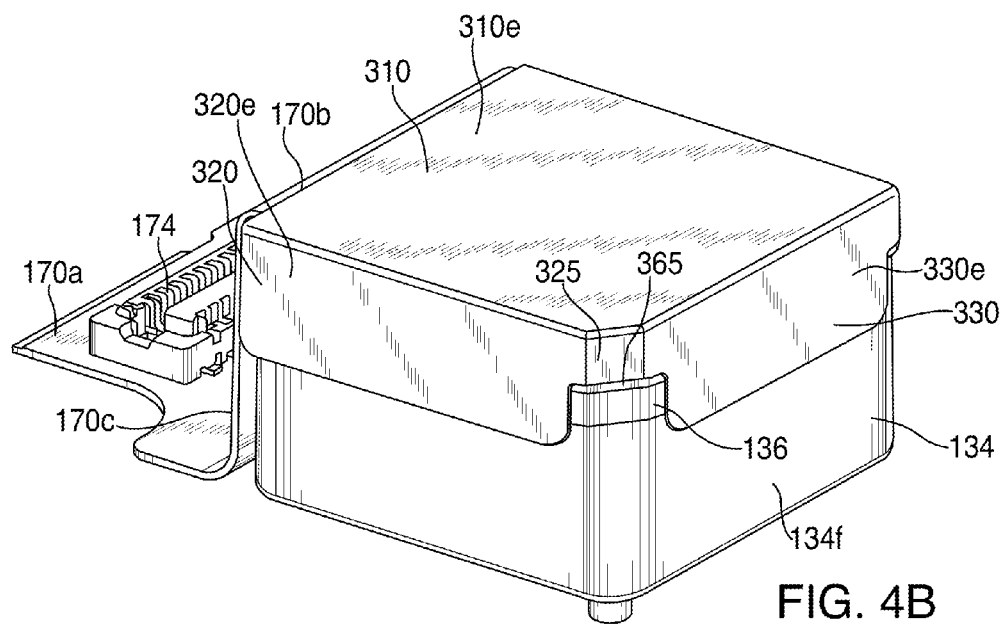
FIG. 4B is a view, similar to FIG. 2B, of the camera module and circuit board of FIG. 2A being enclosed by the enclosure assembly of FIG. 3, in accordance with at least one embodiment.
Figure 4C:
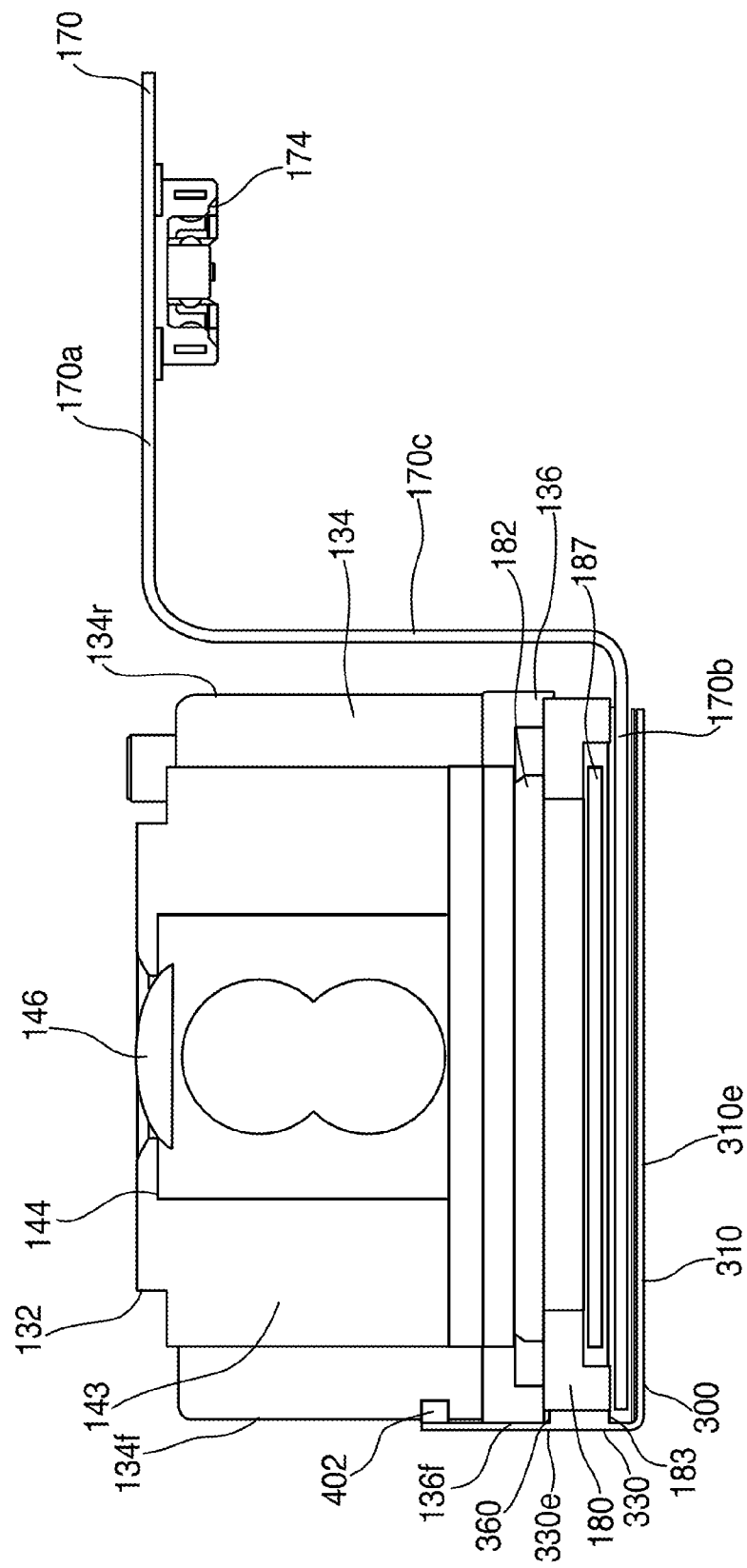
FIG. 4C is a side view of the camera module, circuit board, and enclosure assembly of FIG. 4A, taken from an X-direction of FIG. 4A, in accordance with at least one embodiment.
Figure 4D:
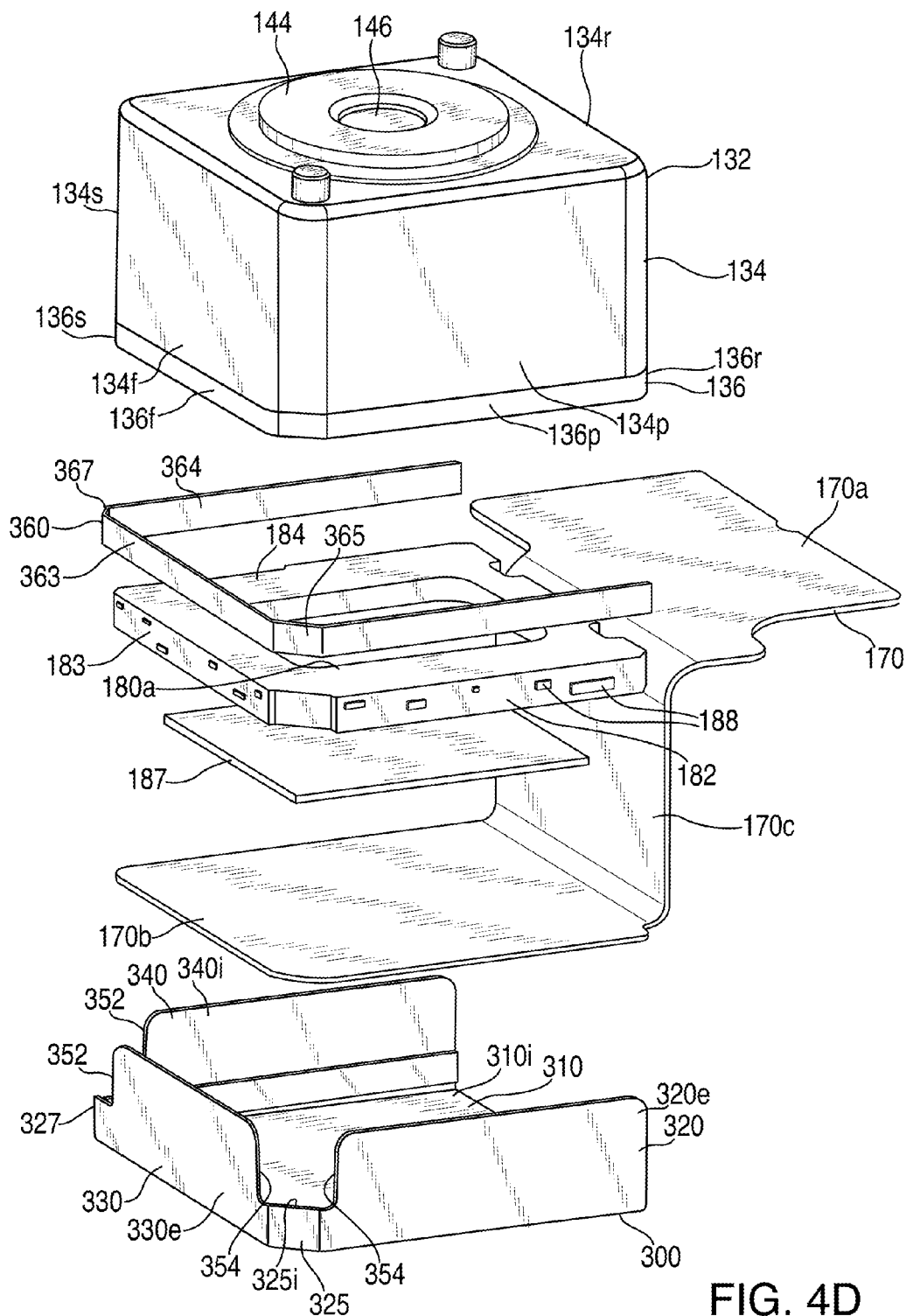
FIG. 4D is an exploded view of the camera module, circuit board, and enclosure assembly of FIG. 4A, in accordance with at least one embodiment.

FIG. 4A is a view, similar to FIG. 2A, of camera module 132 and circuit board 170 being enclosed by enclosure assembly 300. FIG. 4B is a view, similar to FIG. 2B, of camera module 132 and circuit board 170 being enclosed by enclosure assembly 300. FIG. 4C is a side view of camera module 132, circuit board 170, and enclosure assembly 300, taken from an X-direction of FIG. 4A. FIG. 4D is an exploded view of camera module 132, circuit board 170, and enclosure assembly 300. As shown in FIG. 4D, camera module 132 may include a VCM 143 that may couple to optics components 146. For example, VCM 143 may include any suitable type of motor and may be electronically controlled (e.g., via processor 102) to control optics components 146 during image and/or video capture. Camera module 132 may also include a filter 192 that may reside within base structure 136. For example, filter 192 may include any one of a glass filter, a color filter, a dust shield, and any combination thereof, and may be configured to both prevent entry of foreign debris into casing 134 and control an image capturing condition for an image sensor 187.

As shown in FIGS. 4A and 4B, enclosure assembly 300 may be employed in electronic device 100 to at least partially enclose camera module 132 and circuit board 170. In some embodiments, camera module 132 may be fully assembled and mounted to circuit board portion 170b, prior to being enclosed by enclosure assembly 300. As shown in FIGS. 4A and 4B, enclosure assembly 300 may be configured to at least partially enclose substrate 180, base structure 136, and casing 134 of camera module 132, and circuit board portion 170b of circuit board 170. For example, enclosure assembly 300 may at least partially enclose these components by capping or caging around portions of these components.

As shown in FIG. 4C, sidewall 330 may couple to surface 134f of casing 134. In addition, when sidewall 330 couples to surface 134f, portions of sidewall 330 may also couple to surface 136f of base structure 136. In some embodiments, sidewall 330 may couple to surface 134f by fixing to it via one or more conductive coupling members 402. Conductive coupling members 402 may be composed of any suitable material (e.g., conductive epoxy, solder, etc.). As one example, conductive coupling members 402 may be welded joints. For example, when sidewall 330 is placed adjacent to surface 134f, one or more portions of sidewall 330 may be welded (e.g., via spot welding, laser welding, etc.) to surface 134f to form one or more welded joints. As another example, conductive coupling members 402 may be solder joints. For example, solder may first be applied to either portions of sidewall 330 or portions of surface 134f. Subsequently, sidewall 300 and surface 134f may be placed adjacent to each other and fixed via the applied solder.

Although not shown in FIG. 4C, sidewall 320 may similarly couple to each of surface 134p of casing 134 and surface 136p of base structure 136. Moreover, sidewall 340 may also similarly couple to each of surface 134s of casing 134 and surface 136s of base structure 136. In this manner, sidewalls 320, 330, and 340 of enclosure assembly 300 may at least partially enclose camera module 132.

In addition to the sidewalls of enclosure assembly 300 fixing to respective surfaces of casing 134 and base structure 136, base plate 310 may also fix to camera module 132. As shown in FIG. 4C, rather than directly fixing to surfaces of camera module 132, base plate 310 may fix to circuit board portion 170b (e.g., to a bottom surface of circuit board portion 170b). Circuit board portion 170b may, in turn, fix to substrate 180 of camera module 132 (e.g., via ACF bonding, as described above with respect to FIGS. 2A and 2B). In particular, base plate 310 may fix to circuit board portion 170b via one or more conductive coupling members.

In some embodiments, these conductive coupling members may be the same as conductive coupling members 402 that may be used for the sidewalls of enclosure assembly 300. For example, base plate 310 may fix to circuit board portion 170b via conductive epoxy, solder, or the like. In other embodiments, the conductive coupling members may be slightly different from conductive coupling members 402. For example, the conductive coupling members may be composed of softer conductive material (e.g., that may be useful for absorbing shock between circuit board portion 170b and base plate 310). In contrast, conductive coupling members 402 may be composed of stiffer or harder conductive material (e.g., that may have higher silver ("Ag") loading for improving conductivity between the sidewalls of enclosure assembly 300 and the corresponding surfaces of camera module 132).

When enclosure assembly 300 encloses camera module 132 and circuit board portion 170b, enclosure assembly 300 may become grounded. For example, as described above with respect to FIGS. 2A and 2B, circuit board 170 may be coupled to ground, and may include one or more accessible ground points. In particular, various regions of circuit board portion 170b may include ground points in the form of exposed copper. As shown in FIGS. 4C and 4D, sidewalls 320, 330, and 340 may not only couple and fix to corresponding surfaces of casing 134 and base structure 136, but may also couple and fix to circuit board portion 170. That is, while a first portion (e.g., the portion having a length of 'm') of each of sidewalls 320, 330, and 340 may couple and fix to the corresponding surfaces of casing 134 and base structure 136, a second portion (e.g., the portion having a length of 'n') of each of sidewalls 320, 330, and 340 may couple to side portions of circuit board portion 170*b*. These side portions of circuit board portion 170*b* may include some of the one or more accessible ground points, and may thus ground enclosure assembly 300.

In some embodiments, portions of base plate 310 may also couple to ground. For example, when base plate 310 fixes to circuit board portion 170*b*, base plate 310 may fix to some of the one or more of the accessible ground points of circuit board portion 170*b*. In this manner, enclosure assembly 300 may further couple to ground.

When enclosure assembly 300 is grounded in the aforementioned manners, components that may directly contact any portion of enclosure assembly 300 may have a direct path to ground. For example, casing 134 of camera module 132, which may fix to the sidewalls of enclosure assembly 300, may be grounded. In addition to grounding camera module 132, enclosure assembly 300 may also serve one or more other purposes for camera module 132 and circuit board portion 170*b*. For example, as described above with respect to FIGS. 2A and 2B, camera module 132 may be subject to one or more of: (i) EMI cause by exposed electrical terminals, (ii) physical damage, (iii) heat build-up during operation, and (iv) foreign article intrusion. Enclosure assembly 300 may be specifically configured to resolve and/or prevent one or more of these aforementioned issues.

As one benefit of enclosure assembly 300, enclosure assembly 300 may act as an EMI shield around at least a portion of camera module 132. As shown FIGS. 2A, 2B, and 4D, substrate 180 may include exposed electrical terminals 188 that may reside on various surfaces of substrate 180. Each of these exposed electrical terminals 188 may be an endpoint of an electrical trace that may run through substrate 180 and couple to corresponding electrical contacts of an image sensor 187. Image sensor 187 may be capable of capturing one or more images focused on by optics components 146, and may couple to and reside between substrate 180 and circuit board portion 170*b*. Image sensor 187 may be visually coupled to optics components 146 through an opening 180*a* of substrate 180, and may communicate captured image data (e.g., at high speeds) via the electrical traces having exposed electrical terminals 188. As described above, these exposed electrical terminals 188 may cause EMI that may leak and interfere with the operation of other components within electronic device 100. However, because enclosure assembly 300 may be grounded, its enclosure of camera module 132 (e.g., via sidewalls 320, 330, and 340, and base plate 310) may at least partially form an EMI shield around camera module 132. Such a shield may prevent EMI caused by the exposed electrical terminals 188 from leaking to other components of electronic device 100.

Because exposed electrical terminals 188 may carry data signals, it may be important that exposed electrical terminals 188 not directly contact any portion (e.g., sidewalls 320, 330, and 340, and base plate 310) of enclosure assembly 300, upon which exposed electrical terminals 188 may be shorted to ground. To prevent shorting exposed electrical terminals 188 to ground, each one of exposed electrical terminals 188 may couple to a corresponding portion of insulator layer 360 of enclosure assembly 300. In particular, surface 182 of substrate 180 and electrical terminals 188 exposing from surface 182 may couple to insulator layer portion 362 of insulator layer 360. Moreover, surface 183 of substrate 180 and electrical terminals 188 exposing from surface 183 may couple to insulator layer portion 363 of insulator layer 360, and surface 184 of substrate 180 and electrical terminals 188 exposing from surface 184, may couple to insulator layer portion 364 of insulator layer 360. In this manner, each exposed electrical terminal 188 may be prevented from being shorted to ground.

As another benefit of enclosure assembly 300, enclosure assembly 300 may assist in dissipating heat from camera module 132. In some embodiments, casing 134 may be composed of metal, and base structure 136 may be composed of a material (e.g., plastic) that may at least partially deform when subjected to extended periods of heat. Due to high power draw camera module 132 (e.g., by image sensor 187) during image and/or video capturing operations, camera module 132 may generate large amounts of heat, which may affect the structural integrity of base structure 136. However, when enclosure assembly 300 encloses camera module 132, sidewalls 320, 330, and 340 may couple to surfaces 136*p*, 136*f*, and 136*s*, respectively, of base structure 136. Moreover sidewalls 320, 330, and 340 may also couple to surfaces 134*p*, 134*f*, and 134*s*, respectively, of casing 134, as well as surfaces 182, 183, and 184, respectively, of substrate 180. This direct contact of a metallic and heat conductive enclosure assembly 300 with hot portions of camera module 132 may assist in dissipating some of heat away from camera module 132.

As yet another benefit of enclosure assembly 300, enclosure assembly 300 may protect portions of camera module 132 from physical damage. In some embodiments, substrate 180 may be composed of stiff and/or brittle material (e.g., ceramic) that may become damaged (e.g., cracked) during assembly of electronic device 100. For example, substrate 180 may become damaged when subjected to sharp impacts or shocks. However, when enclosure assembly 300 encloses camera module 132, sidewalls 320, 330, and 340 may provide physical barriers around portions of substrate 180 (e.g., surfaces 182, 183, and 184). In this manner, substrate 180 may be protected from becoming physically damaged.

As still another benefit of enclosure assembly 300, enclosure assembly 300 may prevent dust and/or other foreign particles (e.g., that may enter electronic device 100 in environmentally filthy conditions) from interfering with the operation of camera 132. In some embodiments, casing 134 may include one or more openings that may lead to VCM 143 residing within. When electronic device 100 is operating in dusty conditions, for example, foreign debris may find its way through the one or more openings and interrupt (e.g., jam) VCM 143 during its operation. However, when enclosure assembly 300 encloses camera module 132, sidewalls 320, 330, and 340 may cover these one or more openings, and thus prevent any foreign debris from entering into casing 134.

As a further benefit of enclosure assembly 300, enclosure assembly 300 may prevent circuit board portion 170*b* from separating (e.g., peeling off) from camera module 132. In particular, when enclosure assembly 300 encloses camera module 132 and circuit board portion 170*b*, circuit board portion 170*b* may be sandwiched between enclosure assembly 300 and substrate 180, and thus, may be kept in place.

It should be appreciated that insulator layer 360 may be applied on the sidewalls of enclosure assembly 300 in any of a variety of ways. In some embodiments, for example, insulator layer 360 may be deposited onto the sidewalls via spray painting and/or inkjet printing. In these embodiments, portions of sidewalls 320, 330, and 340, that are not to receive insulator layer 360, may first be masked. The masking may, for example, be removed after insulator layer 360 is deposited onto the sidewalls. In other embodiments, insulator layer 360 may be deposited onto the sidewalls in the form of one or more tapes.

Although FIG. 3 shows insulator layer 360 as a single continuous layer that may span the various sidewalls of enclosure assembly 300, in some embodiments, insulator layer 360 may instead include a plurality of insulator layer components. For example, rather than spanning insulator layer 360 over the sidewalls of enclosure assembly 300, insulator layer 360 may include a plurality of separate insulator layer components that may each be positioned on corresponding locations of the sidewalls of enclosure assembly 300. For example, each of the separate insulator layer components may be positioned so as to match a corresponding exposed electrical terminal 188 of substrate 180, when enclosure assembly 300 encloses camera module 132.

Moreover, in some embodiments, rather than residing on enclosure assembly 300, insulator layer 360 may instead reside on surfaces 182, 183, and 184 of substrate 180. In particular, insulator layer 360 may be applied to insulate or cover exposed electrical terminals 188 of substrate 180, prior to enclosing camera module 132 and circuit board portion 170b with enclosure assembly 300. In these embodiments, for example, the insulator layer components may be shaped and sized to reside on corresponding exposed electrical terminals 188. In this manner, each exposed electrical terminal 188 may be insulated from being coupled to ground, when enclosure assembly 300 encloses camera module 132.

Although FIGS. 2A, 2B, and 4A-4D have been described with reference to camera module 132, it should be appreciated that the same or similar description can be made with reference to camera module 196 and/or any other suitable electronic module of electronic device 100. For example, rather than enclosing camera module 132, an enclosure assembly may be provided to enclose any suitable module (e.g., camera LED module) that may be included in an electronic device. In particular, enclosure assembly 300 or any other similar enclosure assembly may be configured and/or altered to enclose any module that may benefit from any one of the advantages that enclosure assembly 300 may provide for camera module 132, for example.

Figure 5:
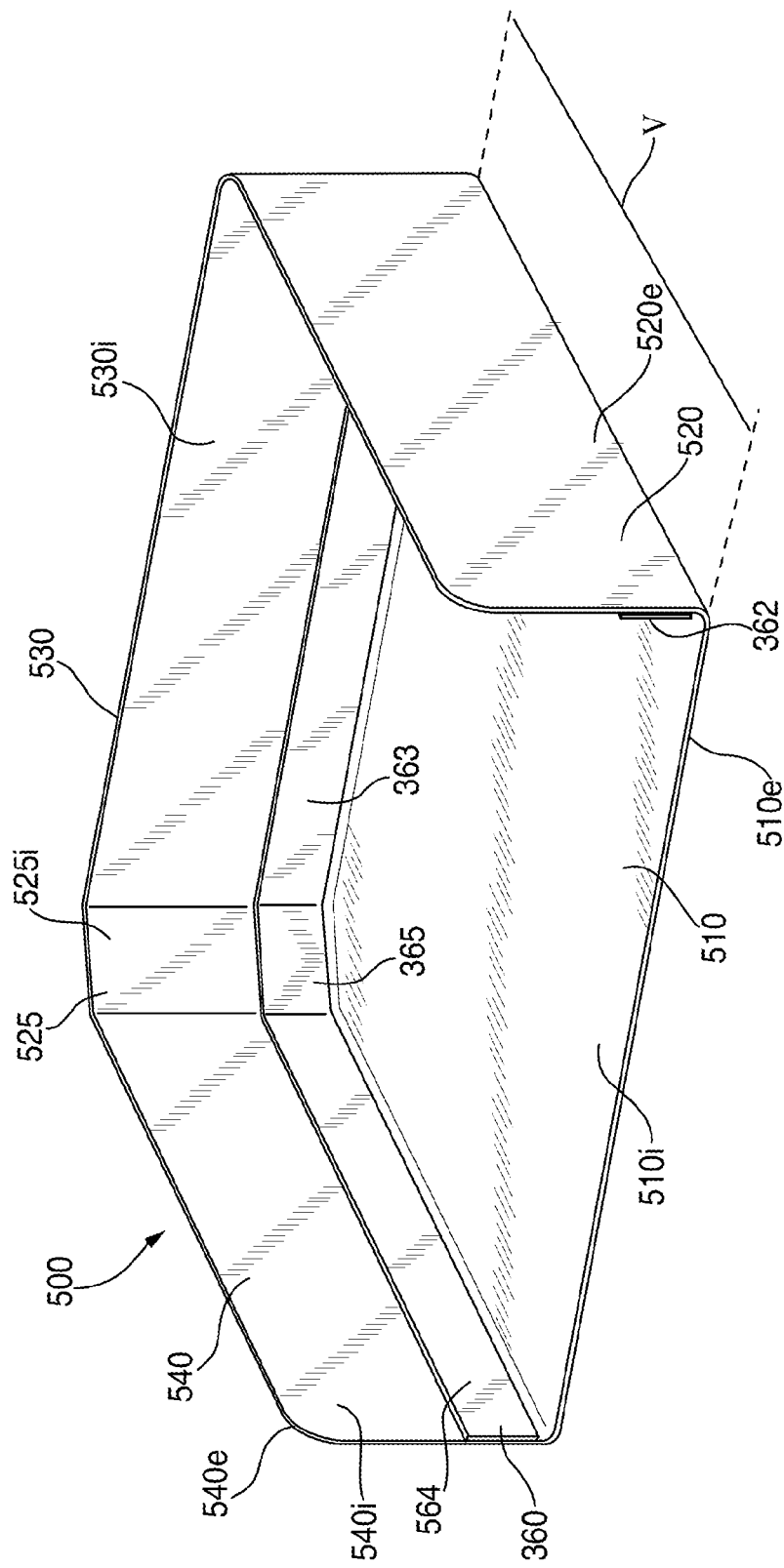
FIG. 5 is a perspective view of a first alternate enclosure assembly, in accordance with at least one embodiment.

FIG. 5 is a perspective view of a first alternate enclosure assembly 500. As shown in FIG. 5, alternate enclosure assembly 500 may be similar to enclosure assembly 300. For example, alternate enclosure assembly 500 may include a base plate 510, and a plurality of sidewalls 520, 530, and 540. Each one of base plate 510 and sidewalls 520, 530, and 540 may include corresponding internal and external sides. For example, base plate 510 may include an internal surface 510i and an external surface 510e. Sidewalls 520, 530, and 540 may include internal surfaces 520i, 530i, and 540i, respectively, and external surfaces 520e, 530e, and 540e. Similar to corner portion 325, corner portion 525 of alternate enclosure assembly 500 may be configured to align with a corresponding corner portion of substrate 180. In addition, sidewalls 530 and 540 may directly couple to each other without an interconnecting corner portion.

However, rather than including gaps (e.g., such as gaps 352 and 354) between sidewalls, alternate enclosure assembly 500 may not include any gaps. In particular, sidewalls 520 and 530 may couple to each other via corner portion 525, without any gaps or open spacing therebetween. By not including gaps between the various sidewalls of alternate enclosure assembly 500, alternate enclosure assembly 500 may enclose more portions of camera module 132. This may, for example, improve protection from EMI caused by camera module 132 and improve heat dissipation for camera module 132.

Similar to enclosure assembly 300, alternate enclosure assembly 500 may also include insulator layer 360. Moreover, similar to enclosure assembly 300, alternate enclosure assembly 500 may be manufactured in any of a variety of ways.

Figure 6:
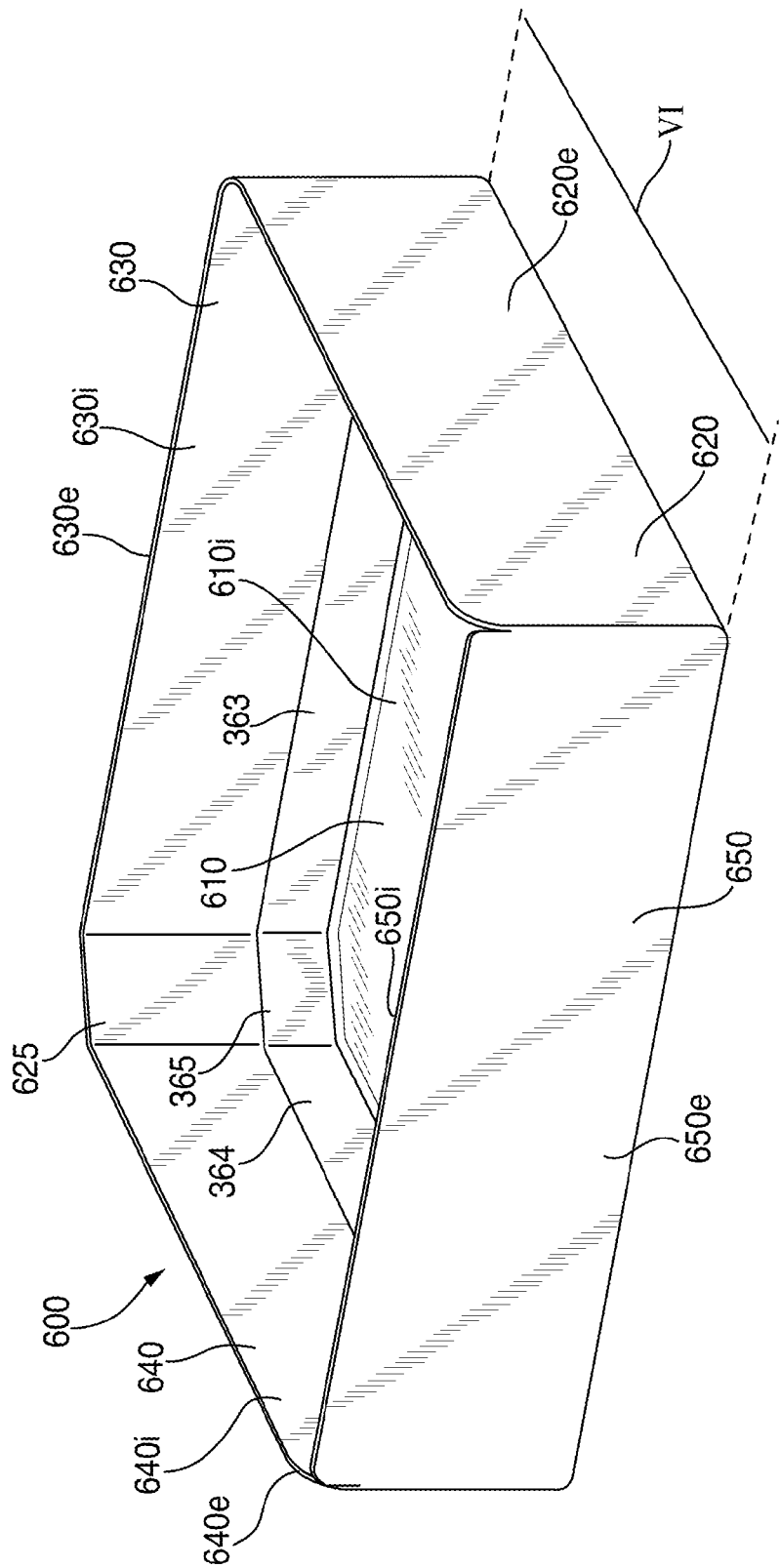
FIG. 6 is a perspective view of a second alternate enclosure assembly, in accordance with at least one embodiment.

FIG. 6 is a perspective view of a second alternate enclosure assembly 600. As shown in FIG. 6, alternate enclosure assembly 600 may be similar to enclosure assemblies 300 and 500. For example, alternate enclosure assembly 600 may include a base plate 610, and a plurality of sidewalls 620, 630, and 640. Each one of base plate 610 and sidewalls 620, 630, and 640 may include corresponding internal and external sides. For example, base plate 610 may include an internal surface 610i and an external surface 610e. Sidewalls 620, 630, and 640 may include internal surfaces 620i, 630i, and 640i, respectively, and external surfaces 620e, 630e, and 640e. Sidewalls 620 and 630 may also couple to each other via a corner portion 625, without any gaps or open spacing therebetween. Similar to corner portion 325, corner portion 625 may be configured to align with a corresponding corner portion of substrate 180. In addition, sidewalls 630 and 640, sidewalls 640 and 650, and sidewalls 650 and 620 may directly couple to each other without any interconnecting corner portions.

However, in addition to sidewalls 620, 630, and 640, alternate enclosure assembly 600 may also include a sidewall 650 that may have an external surface 650e and an internal surface 650i. By including sidewall 650 (e.g., in addition to sidewalls 620, 630, and 640), alternate enclosure assembly 600 may further enclose camera module 132 and circuit board 170. For example, a length VI of alternate enclosure assembly 600 may be larger than any one of lengths III and V of enclosure assemblies 300 and 500, respectively. This larger length may allow alternate enclosure assembly 600 to accommodate and at least partially enclose connecting portion 170c of circuit board 170. As part of the enclosure, sidewall 650 may electrically connect to connecting portion 170c. For example, connecting portion 170c may include a plurality of ground points disposed thereon (not shown) that may electrically couple (e.g., using vias) to portions of sidewall 650. In this manner, in addition to enclosure assembly 600 being grounded (e.g., at base plate 610) via ground points of circuit board portion 170a, enclosure assembly 600 (e.g., sidewall 650) may be further grounded (e.g., at sidewall 650) via ground points of connecting portion 170c of circuit board 170. This may, for example, improve protection from EMI caused by camera module 132 and improve heat dissipation for camera module 132.

Similar to enclosure assemblies 300 and 500, alternate enclosure assembly 600 may also include insulator layer 360. Moreover, similar to enclosure assemblies 300 and 500, alternate enclosure assembly 600 may be manufactured in any of a variety of ways.

Figure 7:
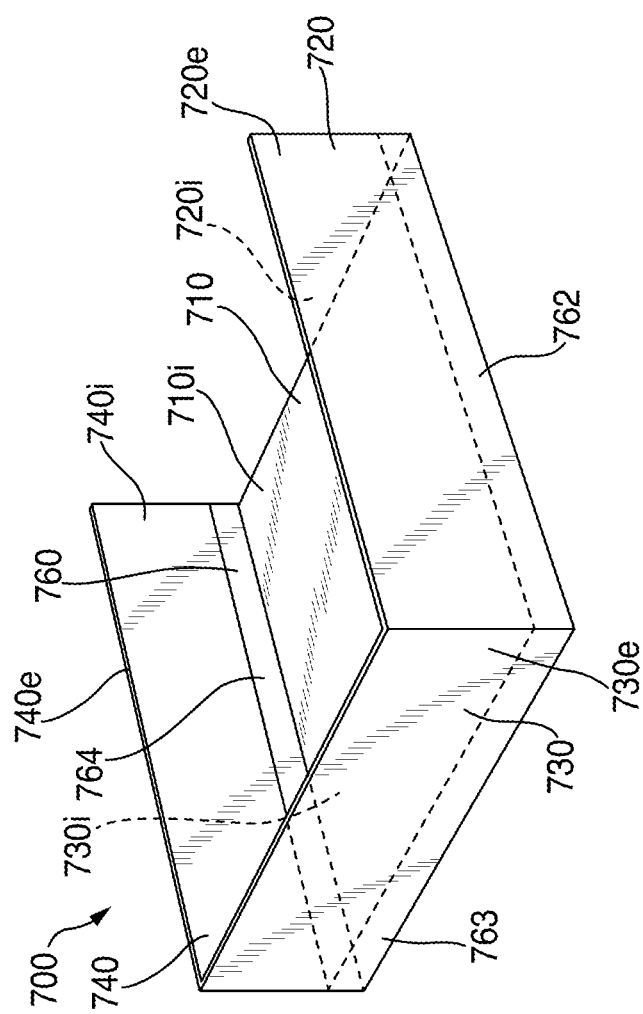
FIG. 7 is a perspective view of a third alternate enclosure assembly, in accordance with at least one embodiment.

As described above, enclosure assembly 300 or any other similar enclosure assembly (e.g., enclosure assemblies 500 and 700) may be configured and/or altered to enclose any suitable module. FIG. 7 is a perspective view of a third alternate enclosure assembly 700. Alternate enclosure assembly 700 may be similar to any one of enclosure assemblies 300, 500, and 600. In some respects, alternate enclosure assembly 700 may be more similar to alternate enclosure assembly 500. As shown in FIG. 7, for example, alternate enclosure assembly 700 may include a base plate 710, and a plurality of sidewalls 720, 730, and 740. Each one of base plate 710 and sidewalls 720, 730, and 740 may include corresponding internal and external sides. For example, base plate 710 may include an internal surface 710i and an external surface 710e. Sidewalls 720, 730, and 740 may include internal surfaces 720i, 730i, and 740i, respectively, and external surfaces 720e, 730e, and 740e. However, rather than including a corner portion (e.g., such as corner portions 325, 525, and 625), sidewalls 720, 730, and 740 may form a single contiguous wall adjacent to base plate 710.

Similar to enclosure assemblies 300, 500, and 600, alternate enclosure assembly 700 may also include an insulator layer 760. Insulator layer 760 may reside above base plate 710 and on internal surfaces of sidewalls 720, 730, and 740. In particular, insulator layer portions 762, 763, and 764 may reside along sidewalls 720, 730, and 740, respectively (e.g., along internal surfaces 720i, 730i, and 740i, respectively).

Figure 8:
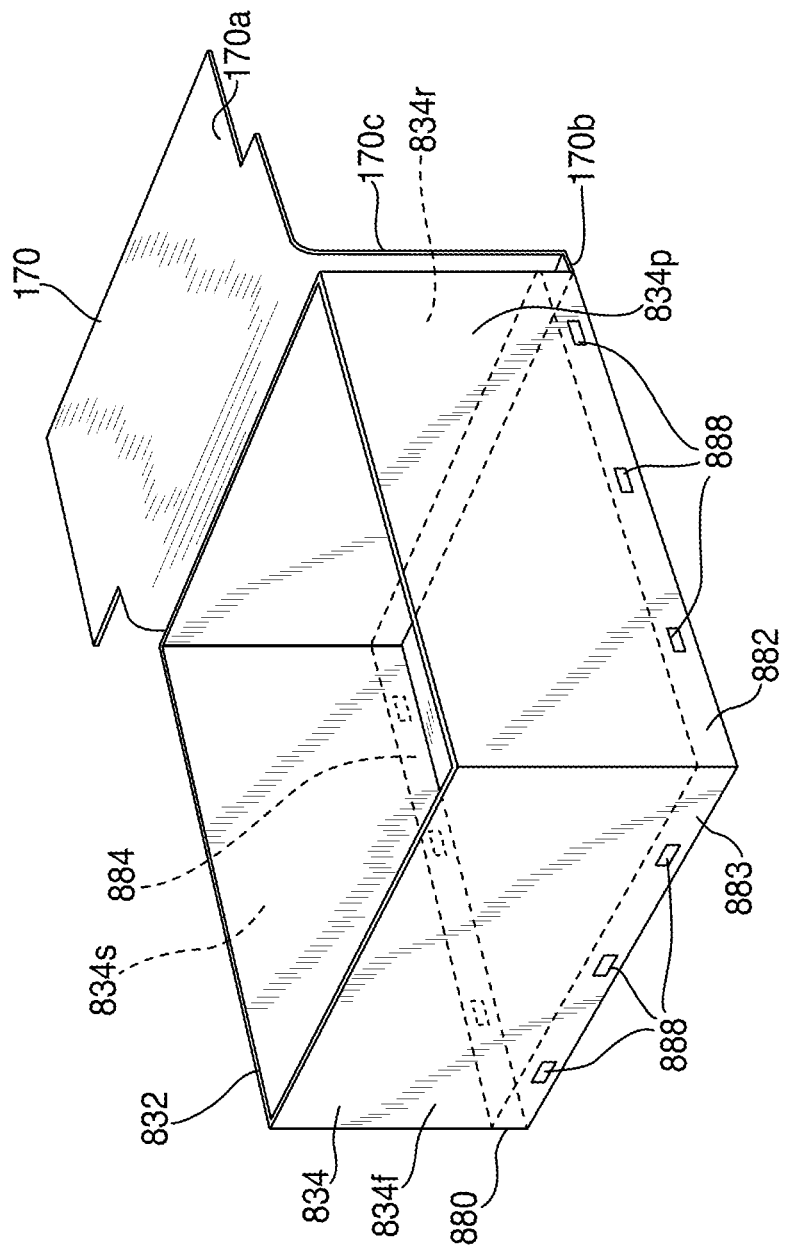
FIG. 8 is a perspective view of a module, in accordance with at least one embodiment.

FIG. 8 is perspective view of a module 832. Module 832 may be similar to camera module 132, and may, for example, be any suitable module that may be included in electronic device 100. As shown in FIG. 8, module 832 may include a casing 834 and a substrate 880. Casing 834 may be composed of any suitable material (e.g., metal) and may include surfaces 834p, 834f, 834s, and 834r. Casing 834 may, for example, reside on substrate 880. Substrate 880 may be composed of any suitable material and may include surfaces 882, 883, and 884. Substrate 880 may also include exposed electrical terminals 888 that may be exposed on one or more surfaces 882, 883, and 884 of substrate 880.

Similar to camera module 132, camera module 132 may reside on a portion of circuit board 170. In particular, substrate 880 may reside (e.g., be mounted) on circuit board portion 170b of circuit board 170. As described above with respect to FIGS. 2A and 2B, circuit board portion 170a may include a plurality of components 174 mounted thereon, and may, for example, be coupled to one or more other components (e.g., processor 102, memory 104, etc.) of electronic device 100.

As shown in FIG. 8, connecting portion 170c may bend and lead to each one of circuit board portions 170a and 170b. Although not shown in FIG. 8, each one of a plurality of electrical contacts on the bottom surface of substrate 880 may couple to a corresponding electrical contact on circuit board portion 170b. In this manner, circuit board 170 may allow communication of information or data between module 832 and one or more components of electronic device 100. Moreover, circuit board 170 may include one or more accessible ground contacts (not shown in FIG. 8) that may provide ground points for any components of electronic device 100 that may require grounding. For example, one or more electrical contacts on the bottom surface of substrate 880 may couple to corresponding ground points of circuit board 170.

Figure 9:
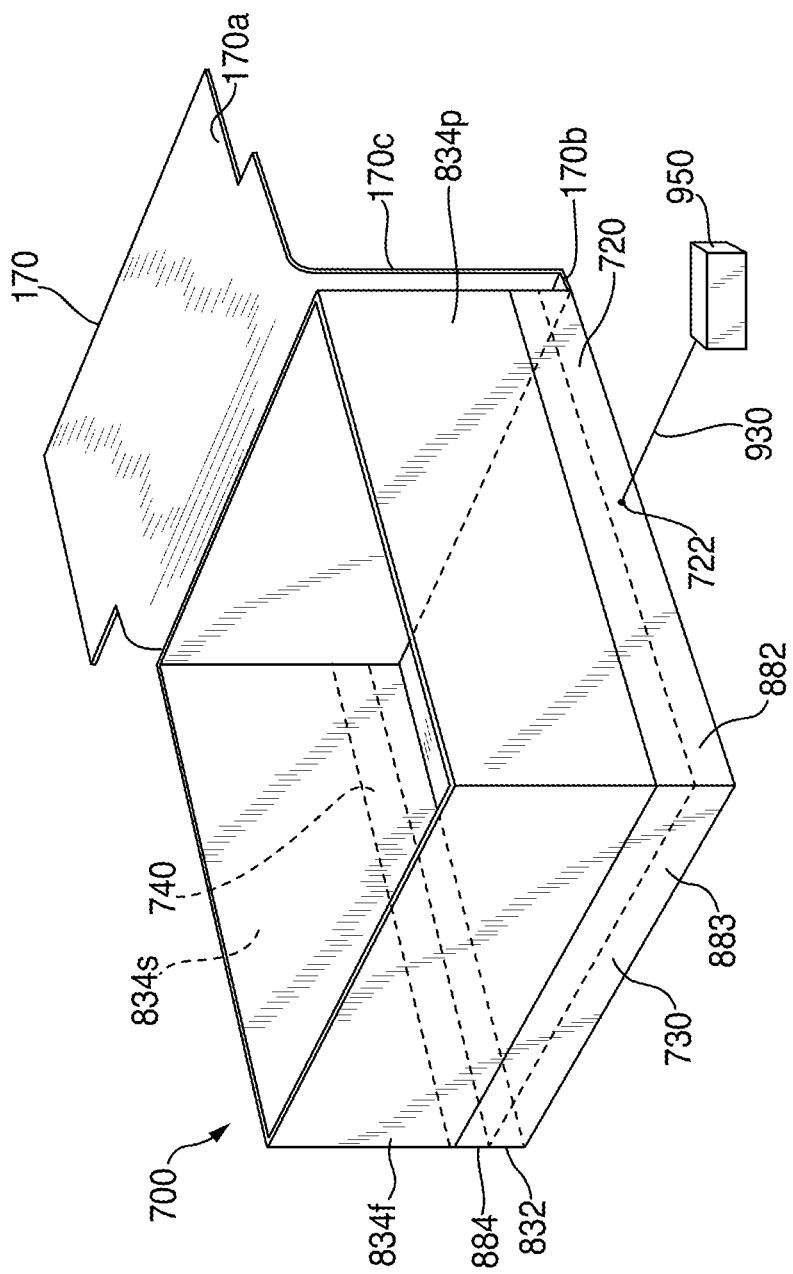
FIG. 9 is a perspective view of the third alternate enclosure assembly of FIG. 7 enclosing the module of FIG. 8, in accordance with at least one embodiment.

FIG. 9 is perspective view of alternate enclosure assembly 700 enclosing module 832. Alternate enclosure assembly 700 may be employed in electronic device 100 to at least partially enclose module 832 and circuit board 170. In particular, alternate enclosure assembly 700 may be configured to at least partially enclose substrate 880 and casing 834 of module 832, and circuit board portion 170b of circuit board 170. For example, alternate enclosure assembly 700 may at least partially enclose these components by capping or caging around portions of these components.

As shown in FIG. 9, sidewalls 720, 730, and 740 may at least partially enclose surfaces 882, 883, and 884, respectively, of substrate 880. Further, sidewalls 720, 730, and 740 may also at least partially enclose surfaces 834p, 834f, and 834s, respectively, of casing 834. Moreover, ground points of circuit board portion 170b may also couple to base plate 710 when alternate enclosure assembly 700 encloses circuit board portion 170b. This may result in alternate enclosure assembly 700 being coupled to ground. As shown in FIG. 9, for example, a point 722 of alternate enclosure assembly 700 may provide (e.g., via an electrical lead 930) a component 950 of electronic device 100 with access to ground. Although not shown in FIG. 9, insulator layer 360 of alternate enclosure assembly 700 may also couple to one or more of the exposed electrical terminals 888 of substrate 880.

Alternate enclosure assembly 700 may serve one or more purposes for module 832 and circuit board 170. Similar to enclosure assembly 300, for example, module 832 may be subject to one or more of: (i) causing EMI by its exposed electrical terminals 888, (ii) physical damage, (iii) heat build-up during operation, and (iv) foreign article intrusion when electronic device 100 is operating in dirty and/or dusty environments. Alternate enclosure assembly 700 may, for example, be configured to resolve and/or prevent each one of these aforementioned potential issues in a similar manner as described above for enclosure assembly 300.

Figure 10:
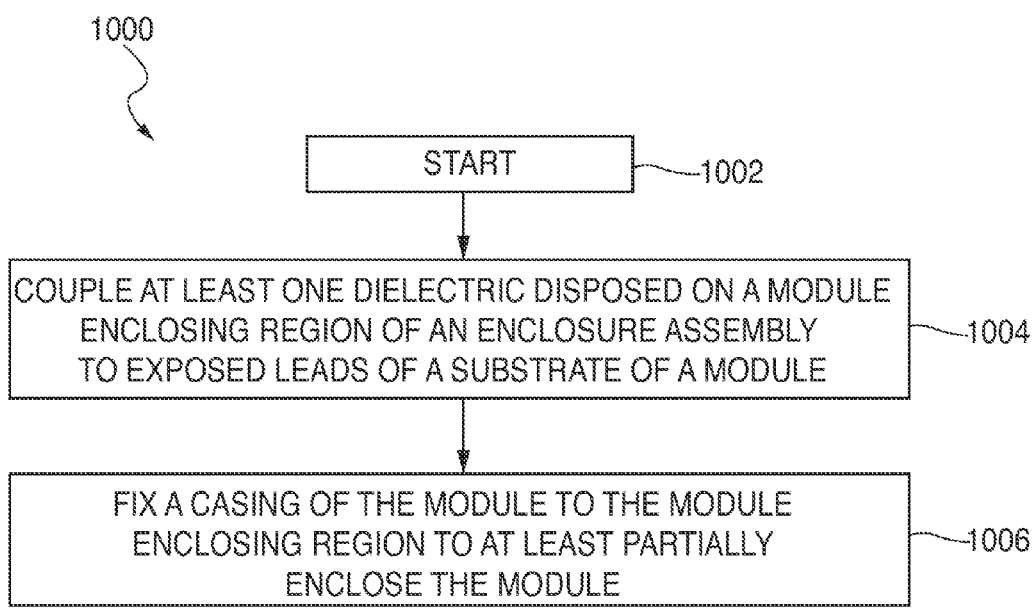
FIG. 10 shows an illustrative process 1000 of enclosing the camera module of FIG. 2A using the enclosure assembly of FIG. 3, in accordance with at least one embodiment.

FIG. 10 shows an illustrative process 1000 of enclosing a module (e.g., camera module 132) using an enclosure assembly (e.g., enclosure assembly 300). The module may include a casing (e.g., casing 134) and a substrate (e.g., substrate 180) having exposed leads (e.g., exposed electrical terminals 188). Moreover, the enclosure assembly may include a module enclosing region having disposed thereon at least one dielectric (e.g., insulator layer 360). Process 1000 may begin at step 1002.

At step 1004, the process may include coupling the at least one dielectric to the exposed leads. For example, the process may include coupling insulator layer 360 to exposed electrical terminals 188. In some embodiments, the at least one dielectric may include dielectric components that may each correspond to a respective one of the exposed leads. In these embodiments, the process may include coupling each of the dielectric components to a respective one of the exposed leads. For example, insulator layer 360 may include insulator layer components that may each correspond to a respective one of exposed electrical terminals 188, and the coupling may include coupling each of the insulator layer components to a respective one of exposed electrical terminals 188.

At step 1006, the process may include fixing the casing to the module enclosing region to at least partially enclose the module. For example, the process may include fixing casing 134 to the module enclosing region to at least partially enclose camera module 132. In some embodiments, the module enclosing region may be formed from base plate 310 and sidewalls 320, 330, and 340, and the fixing may include fixing casing 134 to each one of sidewalls 320, 330, and 340.

Moreover, in some embodiments, prior to the coupling and the fixing, the process may include attaching the substrate to a circuit board. For example, prior to the coupling and the fixing, the process may include mounting substrate 180 onto circuit board portion 170b. In these embodiments, the process may also include attaching circuit board portion 170b to base plate 310.

It is to be understood that the steps shown in process 1000 of FIG. 10 are merely illustrative and that existing steps may be modified or omitted, additional steps may be added, and the order of certain steps may be altered.

While there have been described an enclosure assembly and systems and methods for using the same, it is to be understood that many changes may be made therein without departing from the spirit and scope of the invention. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. It is also to be understood that various directional and orientational terms such as "up" and "down," "front" and "back," "top" and "bottom," "left" and "right," "length" and "width," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Moreover, an electronic device constructed in accordance with the principles of the invention may be of any suitable three-dimensional shape, including, but not limited to, a sphere, cone, octahedron, or combination thereof.

Therefore, those skilled in the art will appreciate that the invention can be practiced by other than the described embodiments, which are presented for purposes of illustration rather than of limitation.

What is claimed is:

1. A system comprising:
  a circuit board;
  a module mounted on the circuit board and having a substrate, wherein the substrate has first and second opposing surfaces connected by an edge surface, wherein the substrate has at least one exposed electrically conductive element on the edge surface, and wherein the first surface is coupled to the circuit board; and
  a conductive enclosure assembly that at least partially encloses the module, wherein the conductive enclosure assembly comprises a base plate, a plurality of sidewalls that each extends from a corresponding edge of the base plate, and an insulator layer disposed on at least one of the sidewalls, and wherein the insulator layer is coupled to the at least one exposed electrically conductive element.

2. The system of claim 1, wherein the first surface is a bottom surface of the substrate.

3. The system of claim 2, wherein the edge surface is substantially perpendicular to the bottom surface.

4. The system of claim 1, wherein the insulator layer is interposed between the edge surface and the at least one of the sidewalls.

5. The system of claim 4, wherein the insulator layer is in direct contact with the at least one of the sidewalls and the at least one exposed electrically conductive element.

6. The system of claim 1, wherein the at least one exposed electrically conductive element comprises an electrical terminal that is an endpoint of an electrical trace that runs through the substrate.

7. The system of claim 1, wherein the plurality of sidewalls comprises four sidewalls that completely surround a periphery of the module.

8. The system of claim 1, wherein the insulator layer is operative to prevent electrical shorting of the at least one exposed electrical element to the conductive enclosure assembly.

9. The system of claim 1, wherein the insulator comprises one of a Polyimide Tape and an insulative paint.

10. The system of claim 1, wherein the module and the conductive enclosure assembly sandwich the circuit board when the conductive enclosure assembly encloses the module.

11. The system of claim 10, wherein the substrate and the base plate sandwich the circuit board, and wherein the base plate is operative to couple to a ground point on the circuit board.

12. The system of claim 1, wherein the plurality of sidewalls forms a contiguous wall along the edges of the enclosure assembly.

13. The system of claim 1, wherein the plurality of sidewalls at least partially encloses five surfaces of the module.

14. The system of claim 1, wherein the module comprises one of a camera module and a camera LED module.

15. The system of claim 1, wherein the insulator layer is in direct contact with the at least one exposed electrically conductive element.

16. The system of claim 1, wherein the substrate has a periphery, and wherein the insulator layer comprises a single insulator layer that runs around the periphery.

17. The system of claim 16, wherein the insulator layer surrounds at least three sides of the substrate.

18. The system of claim 1, wherein at least one exposed electrically conductive element comprises a plurality of exposed electrically conductive elements, wherein the insulator layer comprises a plurality of separate dielectric elements, and wherein each dielectric element of the plurality of separate dielectric elements is coupled to a respective exposed electrically conductive element of the plurality of exposed electrically conductive elements.

* * * * *